United States Patent [19]

Baker et al.

[11] 4,104,589
[45] Aug. 1, 1978

[54] CHUCK FOR USE IN THE TESTING OF SEMICONDUCTOR WAFERS

[75] Inventors: Robert Lee Baker, Conyngham; Calvin Michael Mahoski, Hazleton; John David Partilla, Wilkes-Barre; Harold Robert Ronan, Jr., Mountaintop, all of Pa.

[73] Assignee: RCA Corporation, New York, N.Y.

[21] Appl. No.: 730,332

[22] Filed: Oct. 7, 1976

[51] Int. Cl.² ............... G01R 31/02; G01R 31/22; H01B 13/00
[52] U.S. Cl. ................. 324/158 F; 29/416; 29/624; 324/158 P; 339/117 P
[58] Field of Search ............. 324/158 F, 158 P, 72.5; 339/117 P; 269/21; 29/416, 624

[56] References Cited

U.S. PATENT DOCUMENTS

| | | | |
|---|---|---|---|
| 3,333,274 | 7/1967 | Forcier | 324/158 P |
| 3,543,214 | 11/1970 | Johnston | 339/117 P |
| 3,611,128 | 10/1971 | Nagata | 324/158 P |
| 3,665,509 | 5/1972 | Elkins | 339/117 P |

Primary Examiner—Rudolph V. Rolinec
Assistant Examiner—Ernest F. Karlsen
Attorney, Agent, or Firm—H. Christoffersen; R. P. Williams; R. A. Hays

[57] ABSTRACT

A chuck for use in the testing of semiconductor wafers comprising first and second pluralities of electrically conductive members alternately arranged to provide a wafer receiving surface. The members are substantially completely electrically isolated from each other. Electric power leads and measurement sensing leads are provided to the first plurality of conductive members and the second plurality of conductive members respectively.

13 Claims, 5 Drawing Figures

CHUCK FOR USE IN THE TESTING OF SEMICONDUCTOR WAFERS

The present invention generally relates to the testing of semiconductor device pellets while in wafer form and, in particular, relates to a chuck which permits increased accuracy in the results of those tests.

One step in the processing of semiconductor devices is to perform electrical tests of the device pellets while in wafer form, i.e., before pellet separation. One type device is the conventional power transistor wherein the collector regions of several devices are common to each other prior to pellet separation. The usual electrical testing process is to place a semiconductor wafer, having a plurality of device pellets formed therein, on a conventional vacuum chuck, the common collector contact of the wafer interfacing therewith. The conventional chuck is usually a rather massive brass cylinder. Sets of base and emitter probes are then brought into contact with those respective regions of the pellet to be tested. Each set of probes, base or emitter, is generally comprised of two leads which are electrically isolated from each other. One lead provides power to the pellet under test while the other lead is a measurement sensing lead and is connected to a measuring apparatus. The pair of probes for the collector region, however, are only electrically isolated from each other external to the perimeter of the chuck. That is, the collector probes can be considered as being merged into a single conductive path throughout the chuck. Hence, the current in the collector power lead also flows in the collector measurement sensing lead through the chuck. Measurements are then made between the various contacts, i.e., base, emitter and collector contacts, of the device to determine the electrical characteristics thereof. Each device pellet is tested in this manner with the base and emitter probes moving from pellet to pellet. The base and emitter probe unit is usually equipped with means to place a dye or other noticeable fluid on defective pellets before moving to the next pellet to be tested.

As it turns out, the measurements taken as described above are relatively coarse because a number of errors affect the measurement. The coarseness of the measurements is evidenced by the fact that while many defective device pellets are found at this stage of testing, a substantial number of defective devices are discovered only after the wafer has been separated and each device pellet packaged. This number of defective pellets i.e., those found during the electrical testing after packaging, represents a considerable value, in both man hours and money lost, in the processing steps between separation and packaging. It is highly desirable therefore that the results of the initial electrical tests approach the results of the final electrical tests as closely and as reliably as possible.

Figure 1:
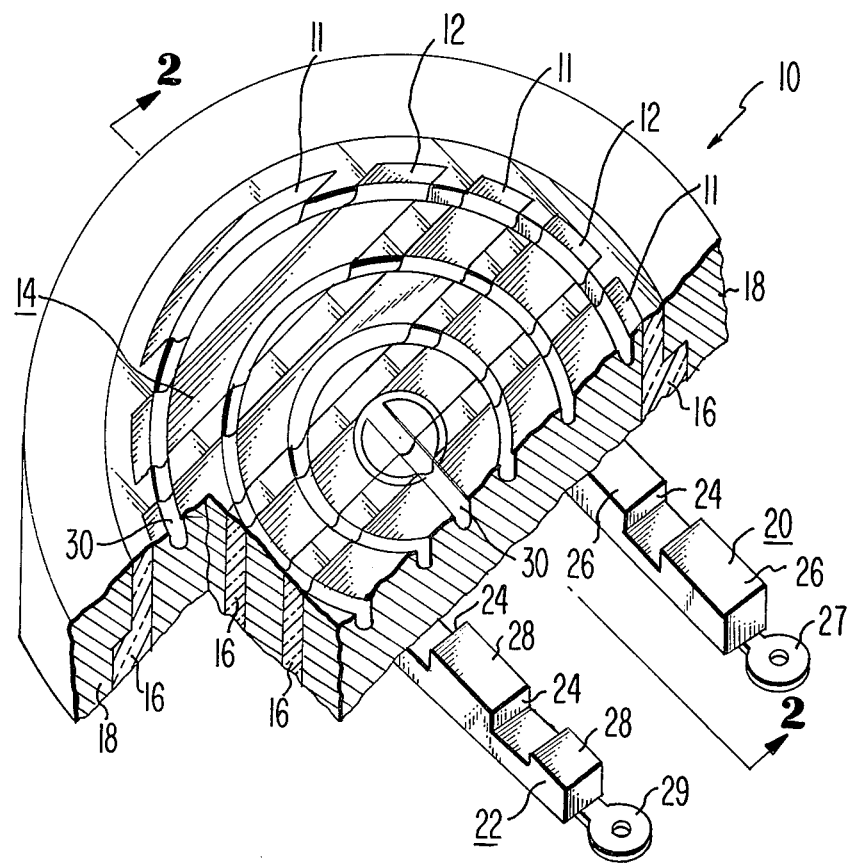
FIG. 1 is a cut-away perspective view of the present novel chuck, not drawn to scale.
Figure 2:
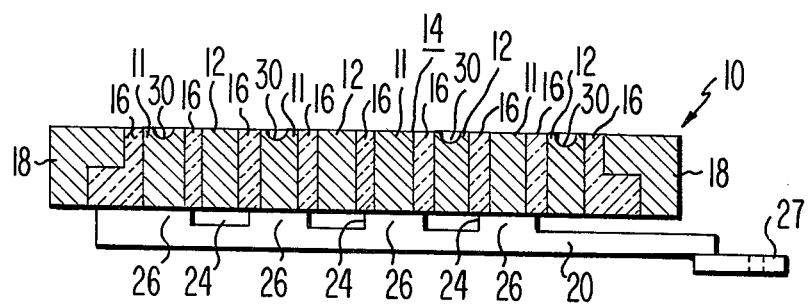
FIG. 2 is a cross-sectional view taken along the line 2—2 of FIG. 1.

The present novel chuck, indicated generally at 10 in the drawings, comprises first and second pluralities of electrically conductive members 11 and 12, respectively. While any conductive material may be used, the preferred material of the members 11 and 12 is brass, primarily because of the heat dissipating qualities thereof. The members 11 and 12, in the preferred embodiment, are elongated, are substantially rectangular in profile, and have substantially the same width. The members 11 and 12 are assembled in alternating fashion to provide a wafer receiving surface 14. While the members 11 and 12 may be any shape, for example, ring shaped, the rectangular profile is preferred since the resulting surface 14, comprised of substantially rectangular members 11 and 12, can be machined, according to the novel method described hereinafter, to a high degree of flatness. The purpose of the flatness characteristic of the wafer receiving surface 14 is explained below.

Dielectric material 16 is interspersed between and around the conductive members 11 and 12 thereby substantially dielectrically isolating each conductive member 11 or 12 from each other conductive member 12 or 11. The dielectric material may be a wax, an epoxy, a plastic or the like. Other than being a dielectric it is preferred that the material 16 be machinable and substantially dimensionally stable. One material presently used is an epoxy known as Stycast 3020. The composition comprises a resin base and two catalysts in the following proportions:

base resin # 3020 - - - 100 grams
catalyst # 9 - - - 3 grams
catalyst # 15 - - - 13 grams The materials described are available from Emerson and Cuning Inc., Canton, Massachusetts. The designations used herein are those of that company.

Means for retaining the conductive members 11 and 12 in position is provided by a ring 18. The retaining ring 18 is substantially electrically isolated from the conductive members 11 and 12 by a portion of the dielectric material 16. While the retaining ring 18 is in the shape of a circular band it may also be a square or a triangle or the like. That is, the wafer receiving surface 14 may be machined to any desired geometric shape. However, since conventional chucks are circular and since semiconductor wafers are substantially circular the circular design of the chuck 10 is preferred.

The first plurality of conductive members 11 are electrically connected together by connecting means 20. The second plurality of conductive members 12 are electrically connected together by connecting means 22. In the preferred embodiment the connecting means 20 and 22 are in the form of brass bus bars having recesses 24 therein. Projections 26 of the means 20, created by the recesses 24 therein, contact the first conductive members 11 and similar projections 28 of the means 22 contact the second conductive members 12. The recesses 24 provide isolation between the means 20 and the second conductive members 12 and also between the means 22 and the first conductive members 11. Preferably the bus bars 20 and 22 contact the respective conductive members 12 and 11 in a direction which is substantially perpendicular to the elongated direction thereof. Operationally as more fully explained below, the means 20 and 22 are power and measurement lead, which are isolated from each other, to the first and second plurality of conductive members 11 and 12, respectively. The connecting means 20 and 22 have attached thereto means 27 and 29 for attaching a power means, not shown, and a measurement sensing means, not shown, to the respective bars.

As shown in FIG. 1 the chuck 10 comprises means 30 integral therewith, in this embodiment, a grooved pattern therein, for holding a semiconductor wafer to the wafer receiving surface 14. A vacuum source, not shown, can be attached to the present chuck 10 so that when a wafer is placed on the surface 14 it is held thereon by the vacuum created in the grooved pattern 28.

The present chuck 10 can be adapted to mount on a conventional electrical testing station fixture not shown, as long as it is electrically isolated therefrom. That is, the chuck 10 must remain substantially completely electrically isolated from the fixture so that electrical shorts between the first and second plurality of conductive members 11 and 12 are avoided.

The present chuck 10 is fabricated by the novel method described below. The initial workpiece of the present method is a substantially cylindrical piece 32 (FIG. 3) of conductive material. As discussed above, brass is preferable. Major opposing faces 34 and 36 of the piece 32 are machined such that the largest variation in thickness across each face 34 and 36 is about 0.001 inch ($\approx 25$ microns) and such that the faces 34 and 36 have a comparative parallelism on the order of about 0.001 inch ($\approx 25$ microns). The degree of flatness mentioned above is necessary in order to provide good electrical contact between a semiconductor wafer to be tested and the semiconductor receiving surface 14. A semiconductor wafer, as the term is used herein, designates a conventional wafer having a plurality of rows of device pellets fabricated therein. A device pellet is a single semiconductor unit substantially completely fabricated. For example, one type device pellet is a transistor having the base, emitter and collector regions thereof formed and the contacts thereto completed. The flatness requirement is further desired to maintain a consistent base and emitter probe contact pressure to each pellet of the wafer under test. For example, if the wafer receiving surface 14 is not flat, or not substantially parallel to the mounting fixture then the base and emitter probes, not shown, being at a fixed distance from a reference plane, for example the mounting fixture, may contact the pellets along a given row of pellets with various degrees of pressure. This may introduce severe errors in the measurements. The degree of parallelism between the opposing faces 34 and 36 is desired since, as discussed below, the sequence of machining operation depends upon both faces being utilized as mounting references. Hence both faces must initially be substantially parallel to each other.

Figure 3:
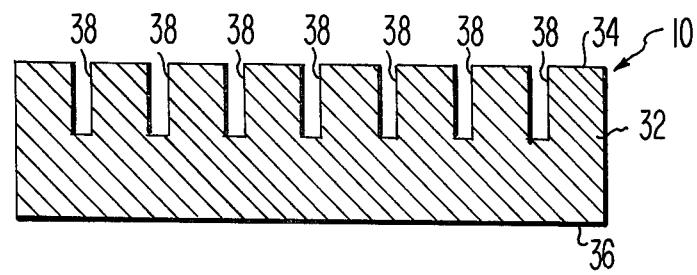
FIGS. 3, 4 and 5 show the present novel chuck in cross-section during different stages of its fabrication, not drawn to scale.
Figure 4:
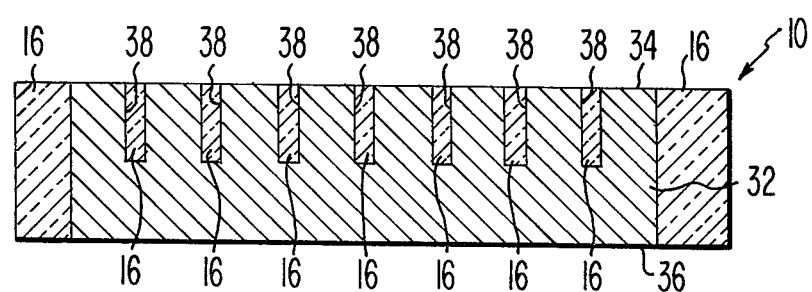
Figure 5:
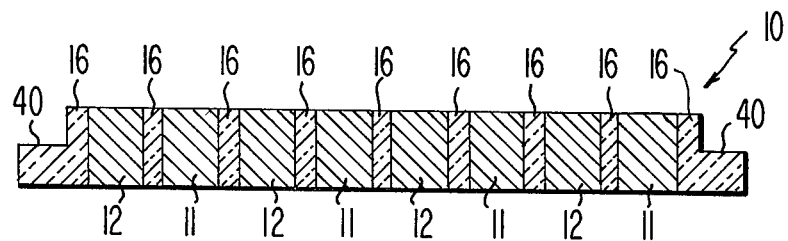

As shown in FIG. 3, a plurality of slots 38 is next formed, by sawing for example, into one of the faces 34. The slots 38 are spaced apart by the width of the final desired width of the conductive members 11 and 12. It is preferred that the sum of the widths of (a) a member 11, (b) an adjacent member 12 and (c) the dielectrically isolating material 16 therebetween be equal to or less than one dimension of the device pellet. Following the formation of the slots 38 they are refilled with the dielectrically isolating material 16, for example Stycast 3020, as shown in FIG. 4. This particular material is preferred because it is machineable and is dimensionally stable. Such characteristics are necessary for the ensuring machine operations. The material 16 is applied while in a high viscosity state and may be spread by doctor blading or the like. After the material 16 has cured and set, the face 34 is machined to remove any material 16 remaining thereon. This machining step results in alternating surface strips of brass and dielectric, i.e., the first and second pluralities of conductive members 11 and 12, respectively, and the dielectrical material 16. The pattern 30 of interconnecting grooves is formed in the face 34 by conventional methods. As shown in FIG. 5 a recessed seat 40 is also machined around the perimeter of the material 16. The seat 40 is shaped to receive the retaining ring 18 discussed above. The workpiece 32 is now turned over and, as discussed above, the face 34 is hereinafter used as a reference while the previous reference face 36 is machined. The remaining brass material connecting the slot separating portions is removed, thereby substantially completely dielectrically isolating the rectangular members 11 and 12, as shown in FIG. 5.

The retaining ring 22 may be fabricated in a conventional manner and pressure fit onto the seat 40 of dielectric material 16 to secure the proper position of the conductive members 11 and 12.

Contacting means 24 and 25 may be fabricated by known machining methods and attached to the conductive members 11 and 12, respectively, in like fashion. Means for attaching power and sensing means, 26 and 27, respectively, to the contacting means 24 and 25, respectively, are provided by conventional methods.

To facilitate the discussion of the operation of the present chuck 10 a brief discussion of the errors inherent in present measurements is presented. One source of measurement errors lies, for example in the fact that the power and measurement sensing leads of the conventional chuck share the same current path, i.e., via the solid brass chuck. Hence, the current introduced into the solid brass chuck solely for operating the device under test, also flows in the measurement sensing lead in the chuck. That is, both the power current and the current to be measured are sensed. At high current measurements, i.e., close to the packaged test level, the additional voltage drop, created by the power current being measured, between the device under test and the measurement lead terminal at the perimeter of the solid brass chuck, creates significant errors. While the sources of all the errors and the reasons therefor are not totally understood, many of these errors are eliminated if the measurement sensing lead has only the current to be measured flowing therein. Thus the voltage drop error caused by the power current flowing in the sensing lead is substantially eliminated.

The present novel chuck 10 permits the measurement of, for all intents and purposes, only the measurement current of the single device pellet under test and thus is capable of making device measurements more accurately. The reason for this lies in the presence of the plurality of conductive members 11 and 12. That is, the first plurality of members 11 are employed only to provide power to the device under test and the second plurality of members 12 provide the measurement lead. Hence the measuring lead only has the error generating effects of a device pellet under test, for example, errors introduced because of the contact resistance between the wafer and the chuck 10. Thus the errors introduced by the current in the power lead is minimal. Measurement errors can be further reduced by maintaining a wafer receiving surface 14 which is quite flat. By being flat the errors caused by variations in contact resistance between the wafer and the wafer receiving surface 14 are reduced.

One of the advantages of the present novel chuck 10 is that it allows accurate high current measurements which more closely approximate final device performance and thereby eliminates much of the cost and waste of mounting unreliable pellets. A resulting advantage of this is that a wafer storage bank is now feasible, i.e., storing devices in wafer form instead of packaged forms. That is, since measurements are capable of closely approximating the final package device performance the wafers can be stored and used only as needed or required. That is, the individual device pellets 18 need not be packaged immediately, tested and then stored, rather the wafer itself may be stored for future use when necessary. This concept saves space storage costs.

What is claimed is:

1. A chuck having a wafer receiving surface for testing semiconductor wafers comprising:
   a first and a second plurality of electrically conductive members, said members being alternately arranged and substantially electrically isolated from each other;
   means for retaining said members together such that said wafer receiving surface is provided;
   means electrically connecting said first plurality of members together;
   means electrically connecting said second plurality of members together;
   means for attaching power and sensing means to said first and second members connecting means, respectively; and
   means, integral with said chuck for holding a semiconductor wafer to said wafer receiving surface.

2. A chuck as claimed in claim 1 further comprising:
   dielectric material interspersed with said plurality of conductive members, thereby dielectrically isolating said first plurality of conductive members from said second plurality of conductive members.

3. A chuck as claimed in claim 1 wherein:
   said holding means comprises a pattern of interconnected grooves within said wafer receiving surface.

4. A chuck as claimed in claim 1 wherein:
   said first and second plurality of conductive members are substantially rectangular in shape.

5. A chuck as claimed in claim 1 wherein:
   said wafer receiving surface is substantially circular.

6. A chuck as claimed in claim 1 wherein:
   the sum of widths of the isolated adjacent members is less than the width of a given dimension of a device pellet of a wafer.

7. A chuck as claimed in claim 1 wherein:
   said retaining means is a retaining ring dielectrically isolated from said conductive members.

8. A chuck as claimed in claim 1 wherein:
   said connecting means are bus bars contacting said respective conductive members in a direction which is substantially perpendicular to the elongated direction thereof.

9. A method of fabricating a chuck having a wafer receiving surface comprising the steps of:
   forming a plurality of slots in one face of a workpiece of conductive material;
   refilling said slots with a dielectric material;
   machining an opposing face of said workpiece until a first and second plurality of separate conductive members is formed, said members being alternately arranged and substantially electrically isolated from each other;
   retaining said conductive members together to form said wafer receiving surface;
   connecting said first plurality of members together;
   connecting said second plurality of members together;
   attaching power and sensing means to said first and second members respectively; and providing means, integral with said chuck, for holding a semiconductor wafer to said wafer receiving surface.

10. A method as claimed in claim 9 wherein said providing step comprises the step of:
    forming a pattern of interconnected grooves in said one face.

11. A method as claimed in claim 9 further comprising the step of:
    machining said faces to a comparative parallelism on the order of about 0.001 inch.

12. A method as claimed in claim 11 further comprising the step of:
    machining each of said faces such that the largest variation in thickness across each face is less than about 0.001 inch.

13. A method as claimed in claim 9 further comprising the step of:
    machining said one face such that the largest variation in thickness thereof is less than about 0.001 inch.

* * * * *